(12) United States Patent
Lee et al.

(10) Patent No.: US 9,711,755 B2
(45) Date of Patent: Jul. 18, 2017

(54) DISPLAY PANELS

(71) Applicant: InnoLux Corporation, Miao-Li County (TW)

(72) Inventors: Kuan-Feng Lee, Miao-Li County (TW); Kuo-Chang Chiang, Miao-Li County (TW); Peng-Cheng Huang, Miao-Li County (TW); Kuei-Ling Liu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/792,874

(22) Filed: Jul. 7, 2015

(65) Prior Publication Data

US 2016/0131929 A1 May 12, 2016

(30) Foreign Application Priority Data

Nov. 12, 2014 (TW) .............................. 103139167 A

(51) Int. Cl.
*H01L 29/04* (2006.01)
*H01L 31/036* (2006.01)
(Continued)

(52) U.S. Cl.
CPC ........ *H01L 51/5246* (2013.01); *G02F 1/1339* (2013.01); *G02F 1/133345* (2013.01);
(Continued)

(58) Field of Classification Search
CPC .. G02F 1/1339; G02F 1/1337; G02F 1/13394; G02F 2001/133357;
(Continued)

(56) References Cited

U.S. PATENT DOCUMENTS 8,237,904 B2 * 8/2012 Chen ................... G02F 1/13394
257/59
8,629,969 B2 1/2014 Motomatsu
(Continued)

FOREIGN PATENT DOCUMENTS

| CN | 1560689 | 1/2005 |
| JP | 2009163207 | 7/2009 |

(Continued)

OTHER PUBLICATIONS

Chinese language office action dated Oct. 14, 2015, issued in application No. TW 103139167.
(Continued)

*Primary Examiner* — Shouxiang Hu
(74) *Attorney, Agent, or Firm* — McClure, Qualey & Rodack, LLP

(57) ABSTRACT

A display panel is provided. The display panel includes a first substrate having a display area and a non-display area. A sealant is disposed on the first substrate and on the non-display area. A planarization layer is disposed on the first substrate. The planarization layer has a first trench formed therein on the non-display area. The first trench has a bottom and a side adjacent to the bottom. The bottom has a roughness that is greater than the roughness of the side.

11 Claims, 8 Drawing Sheets

(51) Int. Cl.
*G02F 1/1339* (2006.01)
*H01L 51/52* (2006.01)
*G02F 1/1333* (2006.01)

(52) U.S. Cl.
CPC ...... *H01L 51/5237* (2013.01); *H01L 51/5253* (2013.01); *G02F 2001/133357* (2013.01); *G02F 2201/50* (2013.01)

(58) Field of Classification Search
CPC ............... H01L 27/124; H01L 51/5246; H01L 51/5237; H01L 51/5253
USPC ..... 257/59, 72; 349/153, 190, 155, 156, 122
See application file for complete search history.

(56) References Cited

U.S. PATENT DOCUMENTS 9,196,804 B2 * 11/2015 Cho .................. H01L 33/56
9,448,441 B2   9/2016 Moriwaki
2009/0237775 A1 * 9/2009 Ito .................. G02F 1/1339
                                                    359/296
2014/0027791 A1   1/2014 Cho et al.
2014/0320789 A1 * 10/2014 Son .................. G02F 1/1337
                                                    349/123

FOREIGN PATENT DOCUMENTS

| JP | 2009175497 | 8/2009 |
| TW | 201120510 | 6/2011 |
| WO | WO 2013/175709 | 11/2013 |
| WO | WO 2014/083807 | 6/2014 |

OTHER PUBLICATIONS

Technical evaluation report for the corresponding utility model patent No. CN 201420673302.0.
Japanese language office action dated Aug. 30, 2016, issued in application No. JP 2015-190575.

* cited by examiner

DISPLAY PANELS

CROSS REFERENCE TO RELATED APPLICATIONS

This Application claims priority of Taiwan Patent Application No. 103139167, filed on Nov. 12, 2014, the entirety of which is incorporated by reference herein.

BACKGROUND

Field of the Invention

The present invention relates to display panel technology, and in particular to a moisture barrier structure of display panels.

Description of the Related Art

Currently, liquid-crystal display (LCD) panels are the primary component in plane displays. An LCD panel basically includes two glass substrates, a liquid-crystal layer sandwiched between the two glass substrates, and a sealant. The two glass substrates are spaced apart from each other by a certain distance. The space between the two substrates is filled with the liquid-crystal layer. Moreover, the sealant is formed on the periphery of the LCD panel to seal the liquid-crystal layer.

The two glass substrates of the LCD panel are a color filter (CF) substrate and a thin-film transistor (TFT) substrate, respectively. The CF substrate has a color filter layer formed thereon. The TFT substrate has a number of TFTs and a number of scan lines and data lines formed thereon. The scan lines and the data lines are electrically connected to the TFTs. The TFTs, the scan lines and the data lines on the TFT substrate are formed from a multilayered structure of metal layers, dielectric layers, and semiconductor layers. The TFTs, the scan lines and the data lines have an uneven surface formed over the TFT substrate. Thus, a planarization layer is formed over the TFT substrate for completely covering the TFTs, the scan lines and the data lines.

The planarization layer over the TFT substrate is usually made of organic materials. The organic materials have a poor ability to resist moisture. Thus, moisture in the environment of the LCD panels may pass through the planarization layer and go inside of the LCD panels. The moisture has disadvantageous effects on the LCD panels.

BRIEF SUMMARY

According to some embodiments of the disclosure, display panels having moisture barrier structures are provided. On the area outside of a display area of the display panels, a trench is formed in a planarization layer. The trench is used as the moisture barrier structure to prevent moisture in the environment of the display panels from entering into the display area of the display panels.

In some embodiments of the disclosure, a display panel is provided. The display panel includes a first substrate having a display area and a non-display area. The display panel also includes a sealant disposed on the first substrate and in the non-display area. The display panel further includes a planarization layer disposed on the first substrate. The planarization layer has a first trench formed therein, and the first trench is disposed in the non-display area. The first trench has a bottom and a side adjacent to the bottom. The bottom of the first trench has a roughness that is greater than the roughness of the side of the first trench.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the contemplated mode of carrying out some embodiments of moisture barrier structures of display panels. This description is made for the purpose of illustrating the general principles of some embodiments of the disclosure and should not be taken in a limiting sense.

It should be emphasized that, in accordance with the standard practice in the industry, various features in the accompanying drawings are not drawn to scale. The dimensions of the various features in the accompanying drawings may be arbitrarily increased or reduced for the sake of simplicity and clarity of discussion.

Figure 1A:
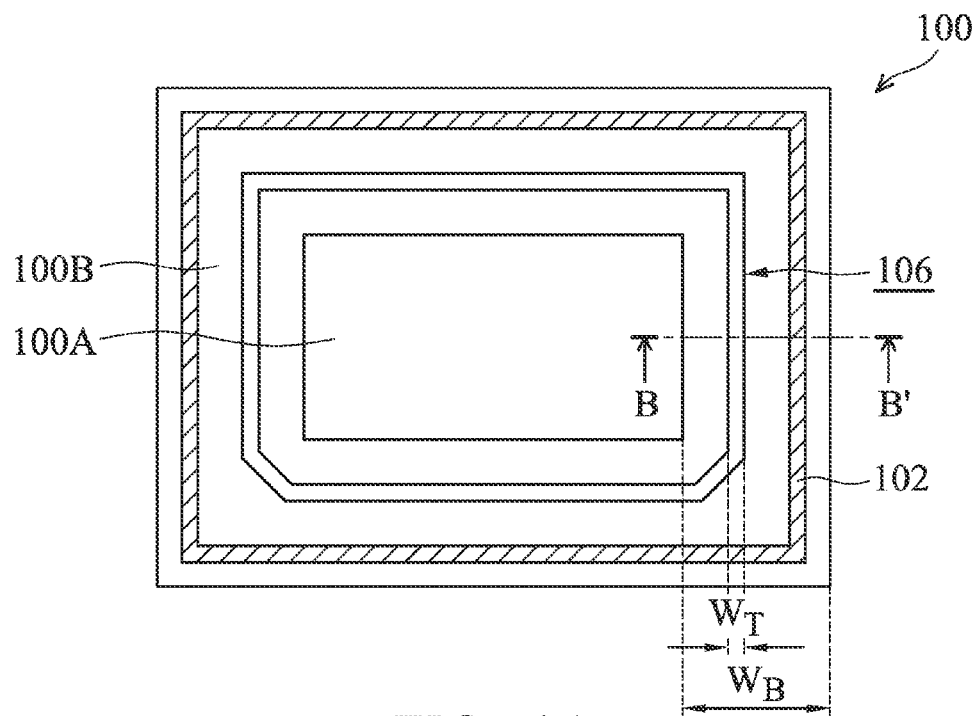
FIG. 1A shows a plane view of a display panel according to some embodiments.
Figure 1B:
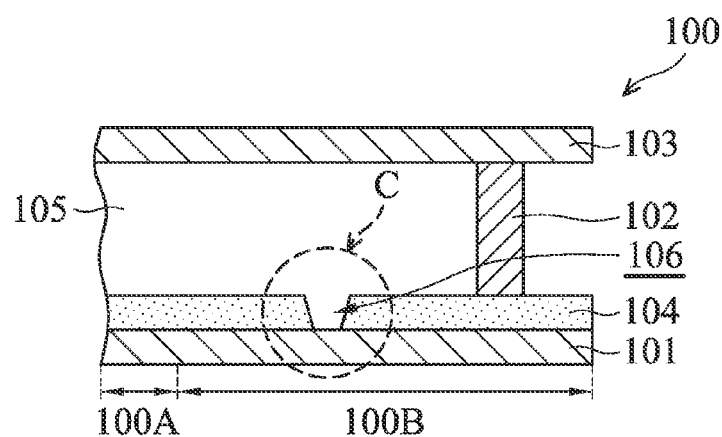
FIG. 1B shows a partial cross section of a display panel, along the line B-B' shown in FIG. 1A, according to some embodiments.

Referring to FIG. 1A, a plane view of a display panel 100 according to some embodiments is shown. The display panel 100 includes a display area 100A and a non-display area 100B. The non-display area 100B disposes outside the display area 100A. In the embodiment, the non-display area 100B surrounds the display area 100A. A sealant 102 is disposed on the non-display area 100B and surrounds the display area 100A. FIG. 1B shows a partial cross section of the display panel 100, along the line B-B' shown in FIG. 1A, according to some embodiments. As shown in FIG. 1B, the display panel 100 includes a first substrate 101 and a second substrate 103 disposed opposite to the first substrate 101. A display medium layer 105 is sandwiched between the first substrate 101 and the second substrate 103. The sealant 102 on the non-display area 100B seals the display medium layer 105 in the space between the first substrate 101 and the second substrate 103.

In some embodiments, the display panel 100 is an LCD panel. The first substrate 101 is a TFT substrate and the second substrate 103 is a CF substrate. The display medium layer 105 is a liquid-crystal layer. In some embodiments, the sealant 102 is formed on the non-display area 100B of the first substrate 101 by a dispersion process. In some other embodiments, the sealant 102 is formed on the non-display area 100B of the second substrate 103 by a dispersion process.

As shown in FIG. 1B, the first substrate 101 includes the display area 100A and the non-display area 100B. In some embodiments, the first substrate 101 is a TFT substrate which has a number of TFTs formed on the display area 100A. The TFTs are arranged in an Array (not shown in FIGS. 1A and 1B). Moreover, a number of scan lines and data lines are formed on the display area 100A of the first substrate 101. The extending directions of the scan lines are substantially perpendicular to the extending directions of the data lines. The TFTs are disposed near the intersections of the scan lines and the data lines. The scan lines and the data lines are electrically connected to the TFTs. Furthermore, a planarization layer 104 is formed over the first substrate 101. The planarization layer 104 completely covers the TFTs, the scan lines and the data lines. In some embodiments, the planarization layer 104 is made of organic polymer materials, for example acrylic-based materials.

According to some embodiments, the planarization layer 104 has a first trench 106 formed therein, and the first trench 106 is disposed on the non-display area 100B. As shown in FIG. 1A, in some embodiments, the first trench 106 is a trench which continuously surrounds the display area 100A. Moreover, the location of the first trench 106 is between the display area 100A and the sealant 102. In addition, as shown in FIG. 1B, the first trench 106 is formed to pass through the planarization layer 104. When moisture in the environment of the display panel 100 permeates to the planarization layer 104 on the non-display area 100B, the first trench 106 formed in the planarization layer 104 on the non-display area 100B effectively prevents the moisture from passing through the planarization layer 104 and entering the display area 100A.

Figure 2A:
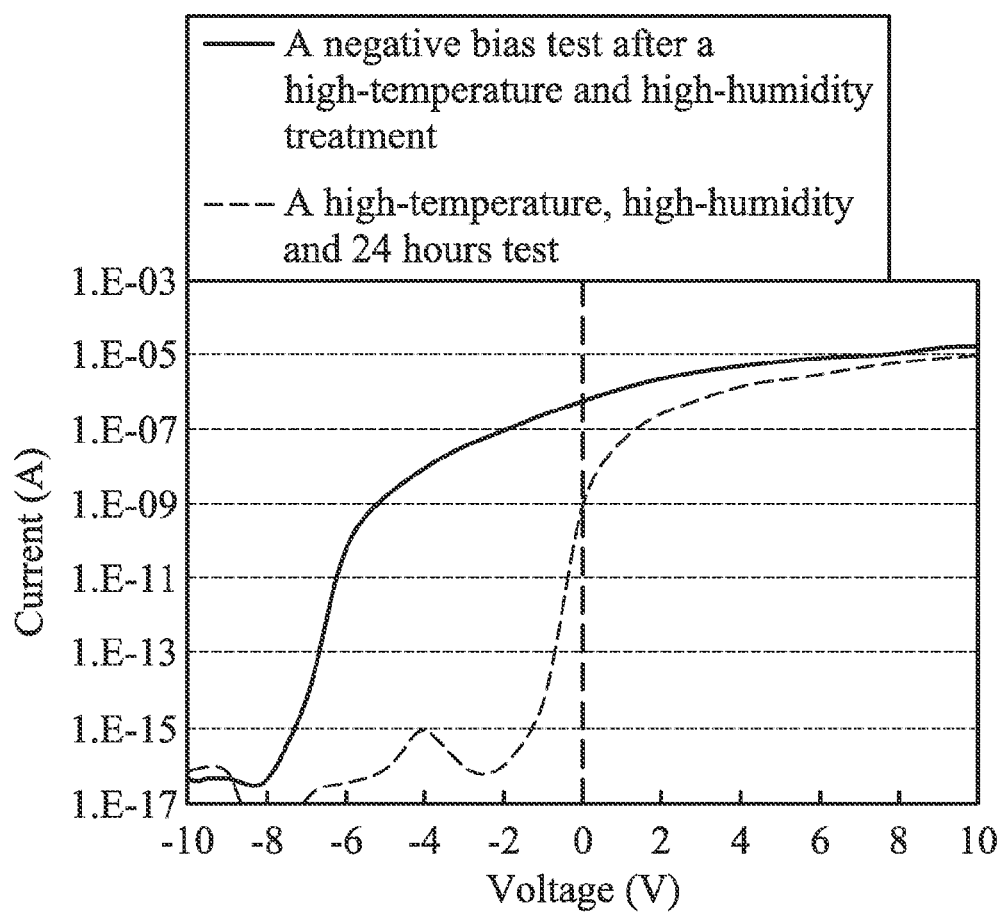
FIG. 2A shows a current-to-voltage curve for electrical characteristics of a TFT which has a planarization layer covering thereon, and the planarization layer absorbs moisture.

The planarization layer 104 also covers the TFTs on the display area 100A. If a planarization layer without a trench formed on the non-display area, moisture in the environment of the display panel 100 will pass through the planarization layer on the non-display area and further permeate to the display area. Then, the moisture in the display area will pass through the planarization layer over TFTs and permeate to several element layers of the TFTs. As a result, while no voltage is applied to the TFTs, a number of electrons are still accumulated in the element layers of the TFTs. Thus, a leakage of current occurs at the TFTs to make the TFTs fail, which is disadvantageous to the display panels. FIG. 2A shows a current-to-voltage curve for electrical characteristics of a TFT. The TFT has a planarization layer covering thereon, and the planarization layer absorbs moisture. As shown in FIG. 2A, it is an example of a display panel without a trench formed in the planarization layer on the non-display area. After a high-temperature, high-humidity, 24-hour test, the planarization layer over the TFT will absorb moisture. The test result of the electrical characteristics of the TFT shows a current being produced in the TFT when no voltage (0V) is applied to the TFT. The test result represents a current leak occurring at the TFT. Moreover, as shown in FIG. 2A, in the example of the display panel without a trench formed in the planarization layer on the non-display area, after a high-temperature, high-humidity and 24 hours treatment, the planarization layer over the TFT will absorb moisture. A negative bias test is performed on the TFT. The test result of the electrical characteristics of the TFT shows a current producing in the TFT when a negative bias voltage (−10V to −2V) is applied to the TFT. The test results mean that the TFT cannot be turned off normally.

Figure 2B:
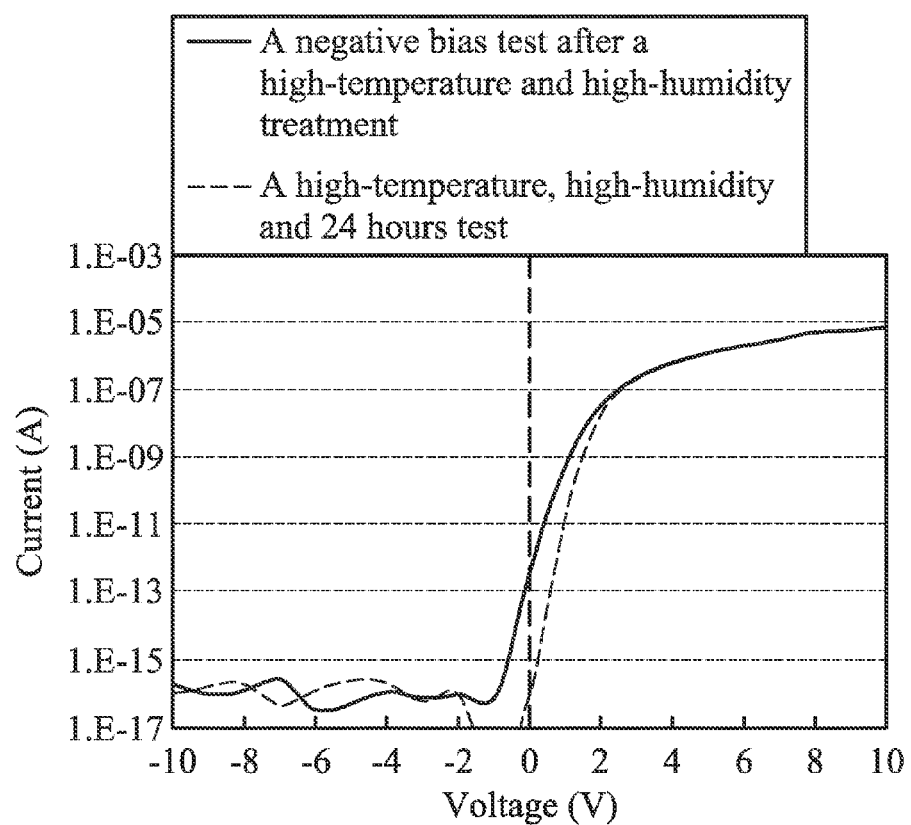
FIG. 2B shows a current-to-voltage curve for electrical characteristics of a TFT which is disposed in a display panel according to some embodiments, the display panel has a planarization layer, and a trench is formed in the planarization layer on a non-display area.

According to some embodiments of the disclosure, the first trench 106 formed in the planarization layer 104 on the non-display area 100B can effectively prevent moisture from passing through the planarization layer 104 on the non-display area 100B and permeating to the display area 100A. Therefore, the display panels of some embodiments of the disclosure can prevent moisture from permeating to the TFTs. Thus, the TFTs will not fail. The reliability of the display panels is thereby enhanced. FIG. 2B shows current-to-voltage curves for electrical characteristics of a TFT which is disposed in a display panel 100 according to some embodiments. The display panel 100 includes a planarization layer 104 having a first trench 106 formed therein on the non-display area 100B. The embodiments of the display panel 100 shown in FIG. 2B include the planarization layer 104 having the first trench 106 formed therein on the non-display area 100B. After a high-temperature, high-humidity and 24 hours test, the first trench 106 can effectively prevent moisture from passing through the planarization layer 104 on the non-display area 100B and also prevent moisture from permeating to the display area 100A. Thus, the planarization layer 104 over the TFTs will apparently reduce the moisture absorbed magnitude. The test result of the electrical characteristics of the TFT shows an infinitesimally small current being produced in the TFT when no voltage (0V) is applied to the TFT. The test result represents that there is an infinitesimally small leakage of current occurring at the TFTs of the display panels in the embodiments of the disclosure. The current leakage produced in the embodiment of FIG. 2B is significantly smaller than that of FIG. 2A. Therefore, the current leakage in the embodiment of FIG. 2B can be omitted. In addition, as shown in FIG. 2B, after a high-temperature, high-humidity and 24 hours treatment, a negative bias test is performed on the TFT. The test result of the electrical characteristics of the TFT shows an infinitesimally small current producing in the TFT when a negative bias voltage (−10V to −2V) is applied to the TFT. The test result represents that the TFTs of the display panels according to the embodiments of the disclosure can be turned off normally.

Figure 1C:
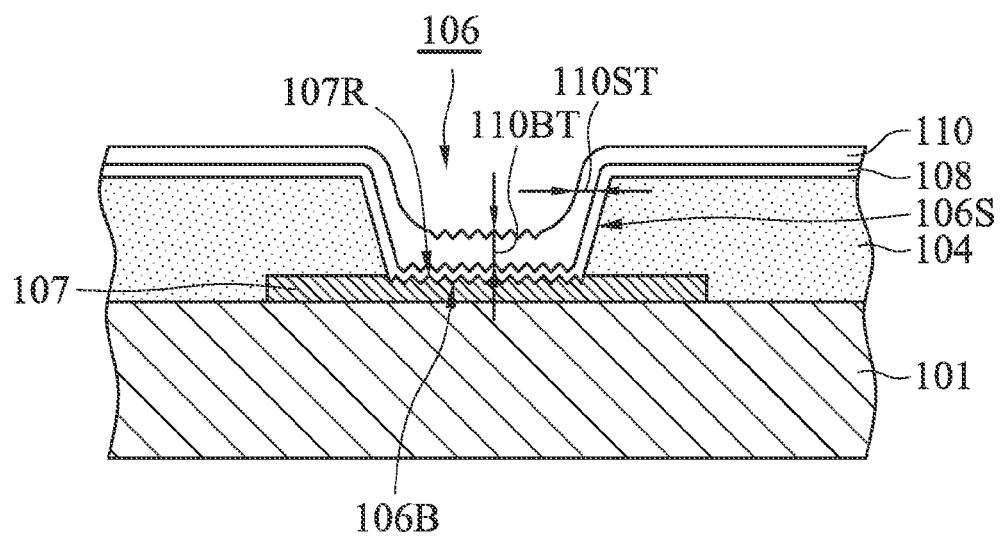
FIG. 1C shows a partial enlarged cross section of a display panel for the area C shown in FIG. 1B, according to some embodiments.

In some embodiments, the material of the planarization layer 104 is an organic material such as a photosensitive polymer material. The first trench 106 in the planarization layer 104 is formed by an exposure and development process. Referring to FIG. 1C, a partial enlarged cross section of a display panel 100 for the area C shown in FIG. 1B according to some embodiments is shown. As shown in FIG. 1C, after the first trench 106 is formed in the planarization layer 104 by the exposure and development process, a partial surface of a metal layer 107 on the first substrate 101 is exposed through the first trench 106. According to some embodiments, the development process of forming the first trench 106 can further etch the exposed surface of the metal layer 107. Thus, the exposed surface of the metal layer 107 has a rough structure 107R. The partial surface of the metal layer 107 exposed through the first trench 106 has a roughness that is greater than the roughness of another partial surface of the metal layer 107 disposed under the planarization layer 104.

In some embodiments, after the first trench 106 is formed in the planarization layer 104, a transparent conductive layer 108 is formed over the first substrate 101. The transparent conductive layer 108 can be used as a top electrode or a bottom electrode of a storage capacitor of the display panel 100. The material of the transparent conductive layer 108 is, for example, indium tin oxide (ITO). The transparent conductive layer 108 includes one layer or two layers of ITO layers. The transparent conductive layer 108 is formed by a deposition process. Moreover, the transparent conductive layer 108 is formed on the planarization layer 104 and is also formed on a bottom 106B and a side 106S adjacent to the bottom 106B of the first trench 106. The transparent conductive layer 108 formed on the bottom 106B of the first trench 106 is deposited on the rough structure 107R of the metal layer 107. Thus, the transparent conductive layer 108 covering the bottom 106B of the first trench 106 also has a rough surface. In addition, the transparent conductive layer 108 formed on the bottom 106B of the first trench 106 is also used as a protective layer for the metal layer 107 disposed under the transparent conductive layer 108. The metal layer 107 is formed to be conductive wires on the non-display area 100B. The metal layer 107 can be electrically connected to the scan lines, the data lines, a pixel electrode, or a common electrode of the display panel for transmitting signals.

In some embodiments, an alignment layer 110 is formed over the first substrate 101. The material of the alignment layer 110 is, for example polyimide (PI), which is coated on the planarization layer 104 by a dispersion process. The alignment layer 110 also covers the bottom 106B and the side 106S of the first trench 106. The alignment layer 110 covering the bottom 106B of the first trench 106 has a thickness 110BT. The alignment layer 110 on the side 106S of the first trench 106 has a thickness 110ST. The thickness 110BT of the alignment layer 110 at the bottom 106B is greater than the thickness 110ST of the alignment layer 110 at the side 106S. Moreover, the transparent conductive layer 108 on the bottom 106B of the first trench 106 has a rough surface. Thus, the alignment layer 110 covering the bottom 106B of the first trench 106 also has a rough surface. Therefore, the bottom 106B of the first trench 106 that is formed in the planarization layer 104 on the non-display area 100B has a roughness that is greater than the roughness of the side 106S of the first trench 106.

The roughness of the bottom 106B of the first trench 106 is greater than the roughness of the side 106S. Therefore, impure particles from the sealant 102 and the display medium layer 105 can enter the first trench 106 through the smooth surface of the side 106S of the first trench 106 and be attached to the rough surface of the bottom 106B of the first trench 106. The impurity particles of the display panel 100 are trapped in the first trench 106 to prevent flicker and image-sticking problems from occurring in the display panel 100. The quality of image display of the display panel 100 is thereby enhanced.

In some embodiments, as shown in FIG. 1A, the first trench 106 has a total length that is shorter than the perimeter of the sealant 102. Moreover, the total length of the first trench 106 is longer than the perimeter of the display area 100A. The perimeter of the display area 100A is the outermost perimeter of an array arranged by all pixels displaying images of the display panel 100. Furthermore, as shown in FIG. 1A, in some embodiments, the non-display area 100B of the display panel 100 has a width $W_B$ that is in a range of about 1 mm to about 3 mm. The first trench 106 has a width $W_T$ that is in a range of about 3 µm to about 20 µm.

Figure 3A:
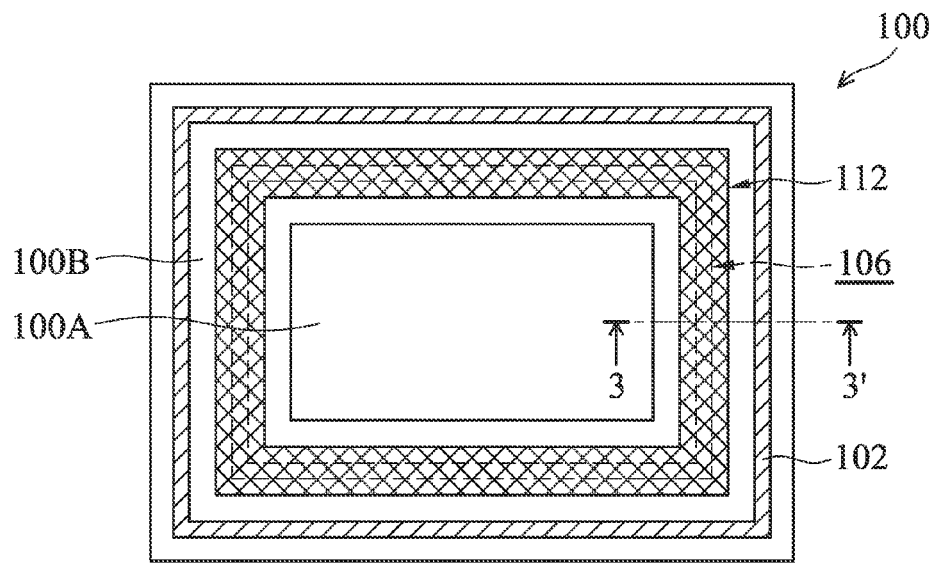
FIG. 3A shows a plane view of a display panel according to some embodiments.
Figure 3B:
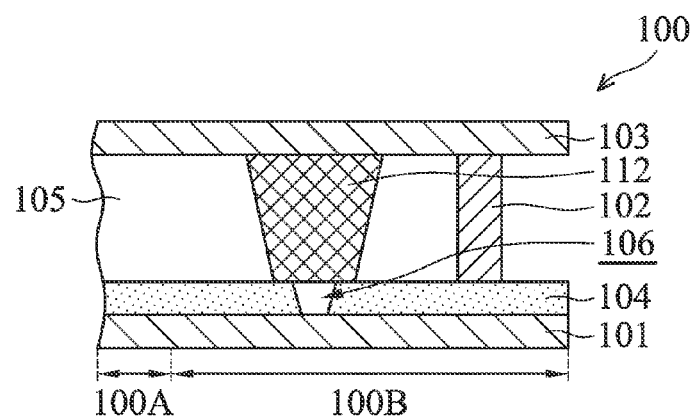
FIG. 3B shows a partial cross section of a display panel, along the line 3-3' shown in FIG. 3A, according to some embodiments.

Referring to FIG. 3A, a plane view of a display panel 100 according to some embodiments is shown. FIG. 3B is a partial cross section of the display panel 100 along the line 3-3' shown in FIG. 3A according to some embodiments. As shown in FIG. 3A and FIG. 3B, the display panel 100 further includes a spacer bar 112 disposed between the first substrate 101 and the second substrate 103. The location of the spacer bar 112 corresponds to the location of the first trench 106. Moreover, the spacer bar 112 is in contact with the top surface of the planarization layer 104. Thus, the spacer bar 112 corresponds to the first trench 106 and is disposed over the first trench 106. In some embodiments, the spacer bar 112 is disposed over the second substrate 103, and the first trench 106 is disposed over the first substrate 101. The spacer bar 112 corresponds to the first trench 106 and is disposed over the first trench 106. Moreover, the spacer bar 112 overlaps with the opening of the first trench 106 while projecting onto the surface of the first substrate 101. In some embodiments, as shown in FIG. 3A, the spacer bar 112 is formed to surround the periphery of the display panel 100 and locate between the display area 100A and the sealant 102. Moreover, the spacer bar 112 corresponds to the first trench 106 and is disposed on the first trench 106. When the display panel 100 is pressed, the spacer bar 112 can prevent the material of the display medium layer 105, for example liquid-crystal material, from impacting the sealant 102 and damaging the reliability of the display panel 100. Specifically, when the display panel 100 is combined with a touch panel to form a touch display device, the spacer bar 112 can further avoid the display panel 100 being damaged by the press action. In some embodiments, the material of the spacer bar 112 is the same as that of photo spacers or is made of dielectric materials such as the materials forming a black matrix of the display panel 10.

Figure 4A:
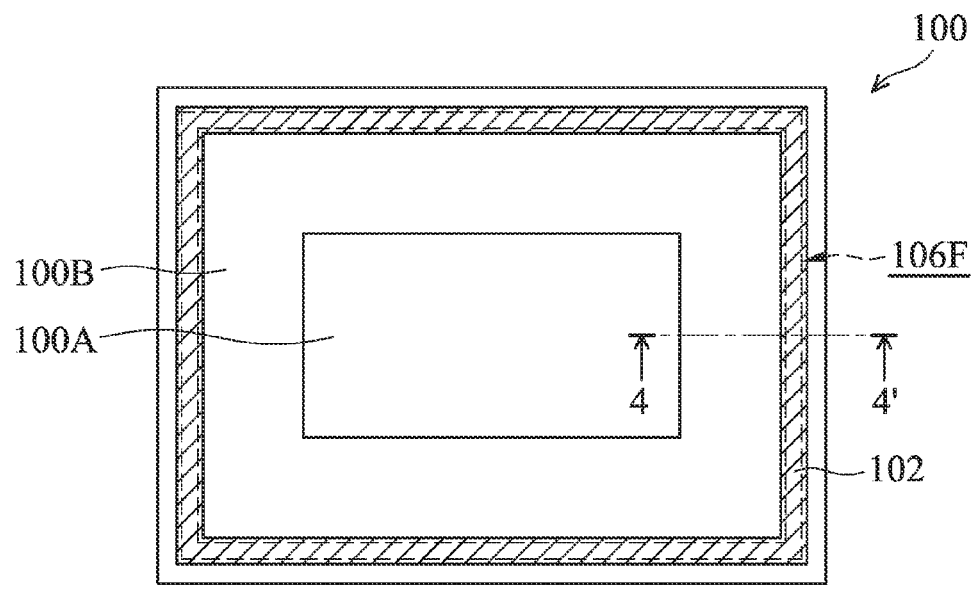
FIG. 4A shows a plane view of a display panel according to some embodiments.
Figure 4B:
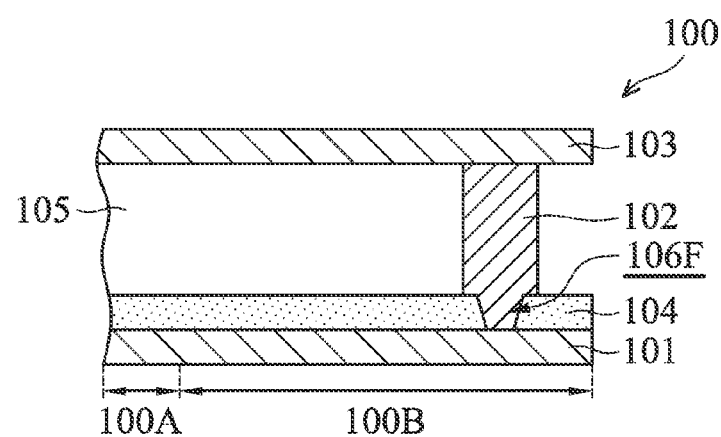
FIG. 4B shows a partial cross section of a display panel, along the line 4-4' shown in FIG. 4A, according to some embodiments.

Referring to FIG. 4A, a plane view of a display panel 100 according to some embodiments is shown. FIG. 4B is a partial cross section of the display panel 100 along the line 4-4' shown in FIG. 4A according to some embodiments. As shown in the embodiments of FIG. 4A and FIG. 4B, the first trench 106F in the planarization layer 104 is disposed under the sealant 102. The first trench 106F is formed to pass through the planarization layer 104. Moreover, a portion of the material for forming the sealant 102 fills the first trench 106F. The first trench 106F and the portion of the sealant 102 filling in the first trench 106F can prevent moisture in the environment of the display panel 100 from passing through the planarization layer 104 and entering the display area 100A. In addition, the first trench 106F can enhance the adhesion between the sealant 102 and the first substrate 101.

In some embodiments, in addition to the first trench 106 shown in FIG. 1A which is between the sealant 102 and the display area 100A, another trench 106F shown in FIG. 4A and FIG. 4B which is under the sealant 102 is also formed in the planarization layer 104. Moreover, in some embodiments, as shown in FIG. 4A, the trench 106F disposed under the sealant 102 has a plane ring-shaped structure that is consistent with the shape of the sealant 102. In some other embodiments, the trench 106F disposed under the sealant 102 consists of several openings (not shown in FIGS. 4A-4B) dispersed on the area of the sealant 102. Each of the openings has a shape of a circle, a square, a strip, or another suitable shape while projecting onto the surface of the first substrate 101.

Figure 5:
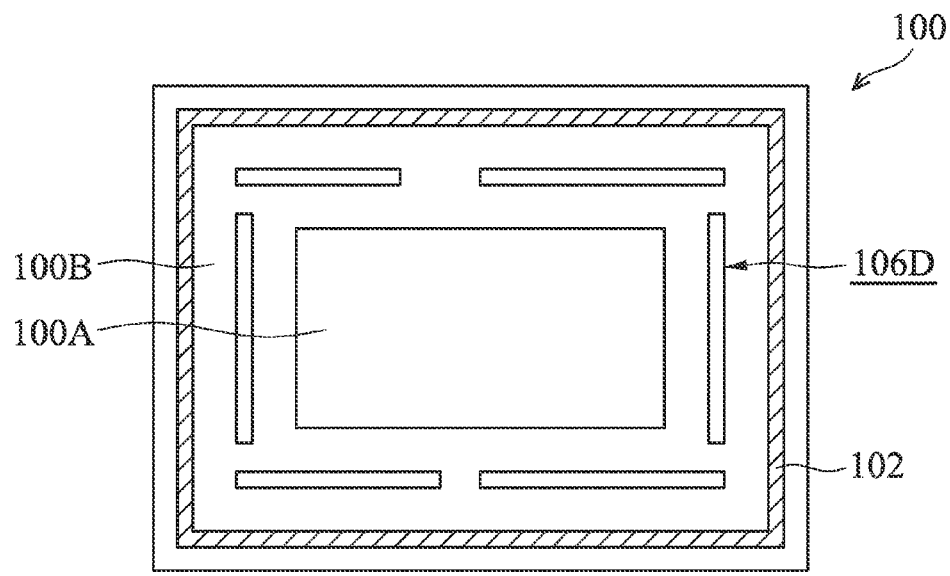
FIGS. 5, 6, and 7 show plane views of display panels according to some embodiments.

FIG. 5 is a plane view of a display panel 100 according to some embodiments. As shown in the embodiments of FIG. 5, a trench 106D is disposed between the sealant 102 and the display area 100A. The trench 106D consists of several openings which are formed to pass through the planarization layer 104. The arrangement of these openings makes the trench 106D have several discontinuous segments to surround the display area 100A. The openings of the discontinuous segments of the trench 106D are formed to pass through the planarization layer 104. In addition, the discontinuous segments of the trench 106D are disposed to surround the display area 100A. Therefore, the trench 106D can prevent moisture in the environment of the display panel 100 from passing through the planarization layer 104 and permeating to the display area 100A.

Figure 6:
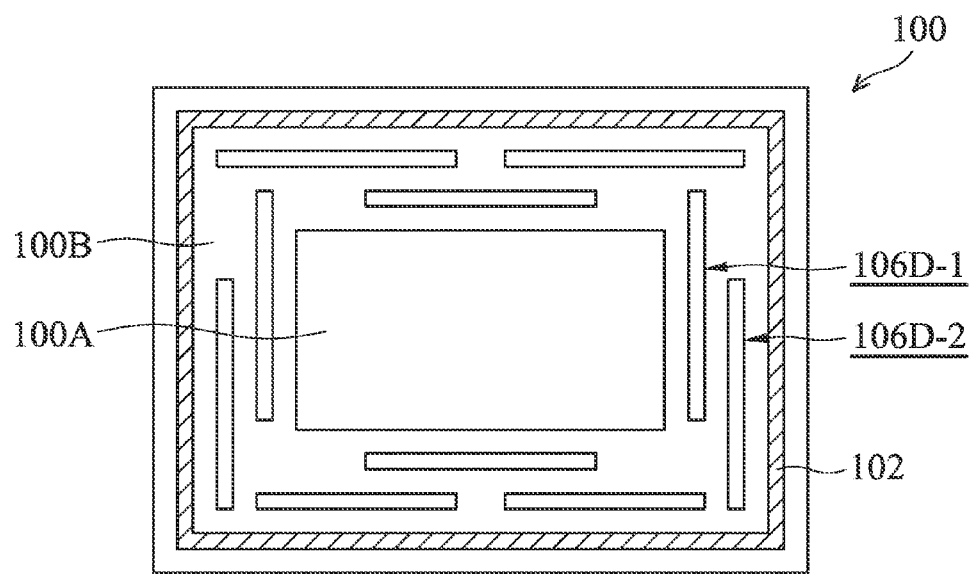

FIG. 6 is a plane view of a display panel 100 according to some embodiments. As shown in the embodiments of FIG. 6, a first trench 106D-1 and a second trench 106D-2 are disposed between the sealant 102 and the display area 100A. The first trench 106D-1 and the second trench 106D-2 respectively have several openings which are formed to pass through the planarization layer 104. The arrangement of these openings makes the first trench 106D-1 and the second trench 106D-2 respectively have several discontinuous segments to surround the display area 100A. The first trench 106D-1 is closer to the display area 100A than the second trench 106D-2. Moreover, the locations of the discontinuous segments of the second trench 106D-2 and the locations of the discontinuous segments of the first trench 106D-1 are staggered and not aligned. Thus, moisture in the environment of the display panel 100 cannot pass through the spaces between the discontinuous segments of the first trench 106D-1 and the spaces between the discontinuous segments of the second trench 106D-2 at the same time. The first trench 106D-1 and the second trench 106D-2 can effectively prevent moisture in the environment of the display panel 100 from permeating to the display area 100A.

Figure 7:
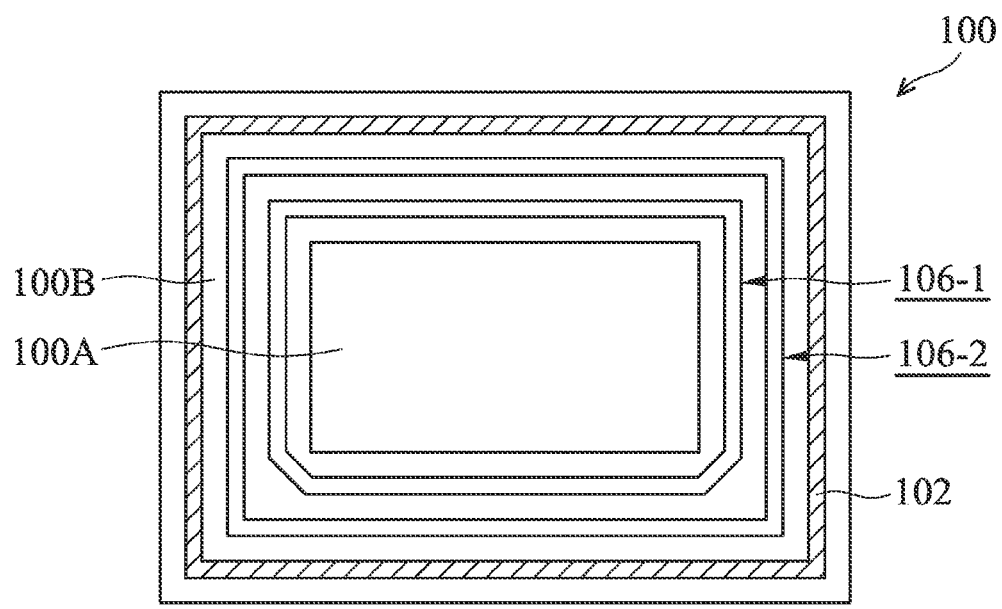

FIG. 7 is a plane view of a display panel 100 according to some embodiments. As shown in the embodiments of FIG. 7, a first trench 106-1 and a second trench 106-2 are disposed between the sealant 102 and the display area 100A. Both the first trench 106-1 and the second trench 106-2 are formed to pass through the planarization layer 104. Moreover, both the first trench 106-1 and the second trench 106-2 have a ring-shaped structure that continuously surrounds the display area 100A. The arrangement of the two ring-shaped trenches 106-1 and 106-2 can more effectively prevent moisture in the environment from permeating to the display area 100A.

According to some embodiments of the disclosure, a trench is formed on the non-display area which is at the periphery of the display area of the display panels. Moreover, the trench is formed to pass through the planarization layer on the first substrate of the display panels. The trench is used as a moisture barrier structure of the display panels to prevent moisture in the environment from passing through the planarization layer on the non-display area and permeating to the display area. Therefore, the trench can prevent the TFTs on the first substrate from being affected by moisture and failing. The reliability of the display panels is thereby enhanced.

In addition, some embodiments of the disclosure can be applied to the second substrate of the display panels. A trench is formed to pass through another planarization layer on the second substrate of the display panels. The trench is formed on the non-display area which is at the periphery of the display area of the display panel. The trench is used as the moisture barrier structure of the display panels. The trench can prevent moisture in the environment from passing through the planarization layer on the second substrate and on the non-display area. Therefore, moisture cannot permeate to the display area of the display panels.

While the disclosure has been described by way of example and in terms of the embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display panel, comprising:
a first substrate comprising a display area and a non-display area, and the first substrate having a first edge and a second edge, wherein the first edge is adjacent to the second edge;
a sealant disposed on the first substrate and on the non-display area; and
a planarization layer disposed on the first substrate and comprising a plurality of openings on the non-display area,
wherein the plurality of openings are formed to pass through the planarization layer, the plurality of openings comprise a first opening, a second opening and a third opening which are disposed between the first edge and the display area, and the sealant surrounds but does not overlap with the plurality of openings in the plan view, and
wherein a first distance is a distance between the first opening and the first edge, a second distance is a distance between the second opening and the first edge, and a third distance is a distance between the third opening and the first edge, wherein the third distance is different from the first distance and the second distance,
wherein a fourth distance is a distance between the first opening and the second edge, a fifth distance is a distance between the second opening and the second edge, and a sixth distance is a distance between the third opening and the second edge, wherein the sixth distance is greater than the fourth distance and less than the fifth distance,
wherein the display panel further comprises a metal layer disposed on the first substrate, a partial surface of the metal layer exposed through the first opening has a first roughness, another partial surface of the metal layer disposed under the planarization layer has a second roughness, and the first roughness is greater than the second roughness, and
wherein the display panel further comprising a transparent conductive layer disposed on the first substrate, wherein the transparent conductive layer is formed on the partial surface of the metal layer exposed through the first opening.

2. The display panel of claim 1, further comprising:
a second substrate disposed opposite to the first substrate; and
a spacer bar disposed between the first substrate and the second substrate, wherein the location of the spacer bar corresponds to the locations of the first opening and the second opening which are close to the sealant adjacent to the first edge of the first substrate.

3. The display panel of claim 2, wherein the spacer bar is disposed on the planarization layer and covers one of the first opening and the second opening.

4. The display panel of claim 2, wherein the first substrate is a thin-film transistor substrate, and the second substrate is a color filter substrate.

5. The display panel of claim 1, wherein the first opening and the second opening close to the sealant along the first edge of the first substrate has a total length that is shorter than the length of the sealant along the first edge of the first substrate.

6. The display panel of claim 1, wherein the total length of the plurality of the openings along the first edge of the first substrate is longer than the length of the display area along the first edge of the first substrate.

7. The display panel of claim 1, further comprising an alignment layer disposed on the first substrate, wherein the alignment layer is formed on the planarization layer and in contact with the bottom and the side of one of the openings, and a thickness of a portion of the alignment layer at the bottom of the one of the openings is greater than a thickness of another portion of the alignment layer at the side of the one of the openings.

8. The display panel of claim 1, wherein the locations of the first opening, the second opening and the third opening are spaced apart from the sealant.

9. The display panel of claim 1, wherein the locations of the first opening and the second opening are close to the first edge and the location of the third opening is far from the first edge.

10. The display panel of claim 1, wherein the plurality of the openings surround the display area.

11. The display panel of claim 1, wherein the first opening, the second opening and the third opening are staggered along the first edge of the first substrate.

* * * * *